(12) United States Patent
Heo

(10) Patent No.: US 10,466,759 B2
(45) Date of Patent: Nov. 5, 2019

(54) METHOD AND APPARATUS FOR MANAGING POWER SUPPLY OF ELECTRONIC DEVICE

(71) Applicant: LG ELECTRONICS INC., Seoul (KR)

(72) Inventor: Sung Yong Heo, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 305 days.

(21) Appl. No.: 15/632,595

(22) Filed: Jun. 26, 2017

(65) Prior Publication Data
US 2018/0004272 A1   Jan. 4, 2018

(30) Foreign Application Priority Data

Jul. 1, 2016 (KR) .......................... 10-2016-0083688

(51) Int. Cl.
*G01R 31/40* (2014.01)
*G06F 1/3206* (2019.01)
(Continued)

(52) U.S. Cl.
CPC ........... *G06F 1/3206* (2013.01); *G01R 31/40* (2013.01); *G06F 1/26* (2013.01); *G06F 1/263* (2013.01);
(Continued)

(58) Field of Classification Search
CPC ...... G01R 1/28; G01R 19/04; G01R 19/2506; G01R 19/0038; G01R 29/00; G01R 29/02; G01R 31/40; G01F 1/3206; G06F 1/26; G06F 1/3296; H02J 9/06; H02M 2001/0032
(Continued)

(56) References Cited

U.S. PATENT DOCUMENTS 3,662,182 A * 5/1972 Ullmann .................. H02H 3/50
                                                                         307/64
5,182,518 A * 1/1993 Stich ....................... G01R 31/40
                                                                         307/66
(Continued)

FOREIGN PATENT DOCUMENTS

JP    H 07-177684    7/1995
JP    H 08-327710    12/1996
(Continued)

*Primary Examiner* — Tung X Nguyen
*Assistant Examiner* — Robert P Alejnikov, Jr.
(74) *Attorney, Agent, or Firm* — KED & Associates, LLP

(57) ABSTRACT

A method for managing an input power supply of an electronic device includes measuring an input voltage that is input from an input power supply; generating an approximate fundamental wave with respect to the input voltage using a maximum value of the input voltage and values of a fundamental wave; calculating at least one of an index value or an index variance with respect to the input power supply using differences between the input voltage and the approximate fundamental wave; and identifying a type of the input power supply based on the at least one of the index value and the index variance. When the input power supply is identified as an uninterruptable power supply, the electronic device may be controlled to operate in a minimum power consumption mode.

20 Claims, 12 Drawing Sheets

(51) Int. Cl.
  *G06F 1/26* (2006.01)
  *G06F 1/3296* (2019.01)
  *H02J 9/06* (2006.01)
  *H02M 1/00* (2006.01)
  *G01R 31/42* (2006.01)
  *G01R 23/20* (2006.01)

(52) U.S. Cl.
  CPC ............ G06F 1/3296 (2013.01); *G01R 23/20* (2013.01); *G01R 31/42* (2013.01); *H02J 9/062* (2013.01); *H02M 2001/0032* (2013.01)

(58) Field of Classification Search
  USPC .......................................... 324/76.12, 76.13
  See application file for complete search history.

(56) References Cited

U.S. PATENT DOCUMENTS

| | | | | |
|---|---|---|---|---|
| 5,570,002 | A * | 10/1996 | Castleman | G05F 1/577 307/31 |
| 7,278,120 | B2 * | 10/2007 | Rahmat | G06F 17/5081 716/111 |
| 2005/0169659 | A1 * | 8/2005 | Koyama | G03G 15/5004 399/88 |
| 2011/0004324 | A1 * | 1/2011 | Bickel | G01D 4/002 700/3 |
| 2014/0069314 | A1 * | 3/2014 | Frey | G08B 3/06 116/3 |

FOREIGN PATENT DOCUMENTS

| | | |
|---|---|---|
| JP | 2006-073485 | 3/2006 |
| JP | 2014-189963 | 10/2014 |

\* cited by examiner

FIG. 8

| | |
|---|---|
| Sin θ$_1$ | 0 |
| Sin θ$_2$ | 0.0029 |
| Sin θ$_3$ | 0.0037 |
| ⋮ | ⋮ |
| Sin θ$_{11}$ | 0.0124 |
| Sin θ$_{12}$ | 0.0138 |
| Sin θ$_{13}$ | 0.0147 |
| ⋮ | ⋮ |
| Sin θ$_{1022}$ | 0.0031 |
| Sin θ$_{1023}$ | 0.0026 |
| Sin θ$_{1024}$ | 0 |

FIG. 10

| ITEM | COMMERCIALLY SUPPLIED POWER | | | | | | | | |
|---|---|---|---|---|---|---|---|---|---|
| | (1) | | | (2) | | | (3) | | |
| | IDLE | LOAD | | IDLE | LOAD | | IDLE | LOAD | |
| | | 20W | 50W | | 20W | 50W | | 20W | 50W |
| Index | 80 | 94 | 99 | 81 | 80 | 86 | 163 | 160 | 162 |
| Index VARIANCE | 8 | 8 | 9 | 8 | 9 | 9 | 11 | 10 | 11 |

FIG. 11

| ITEM | UPS | | | | | | | | | | | | |
|---|---|---|---|---|---|---|---|---|---|---|---|---|---|
| | (4) | | | IDLE | (5) | | | IDLE | (6) | | | IDLE | (7) | |
| | IDLE | LOAD | | | | LOAD | | | | LOAD | | | | LOAD | |
| | | 20W | 50W | | | 20W | 50W | | | 20W | 50W | | | 20W | 50W |
| Index | 330 | 927 | 1650 | 290 | | 405 | 740 | 3900 | | 3660 | 3378 | 1100 | | 850 | 900 |
| Index VARIANCE | 18 | 50 | 70 | 13 | | 15 | 14 | 12 | | 12 | 12 | 60 | | 62 | 65 |

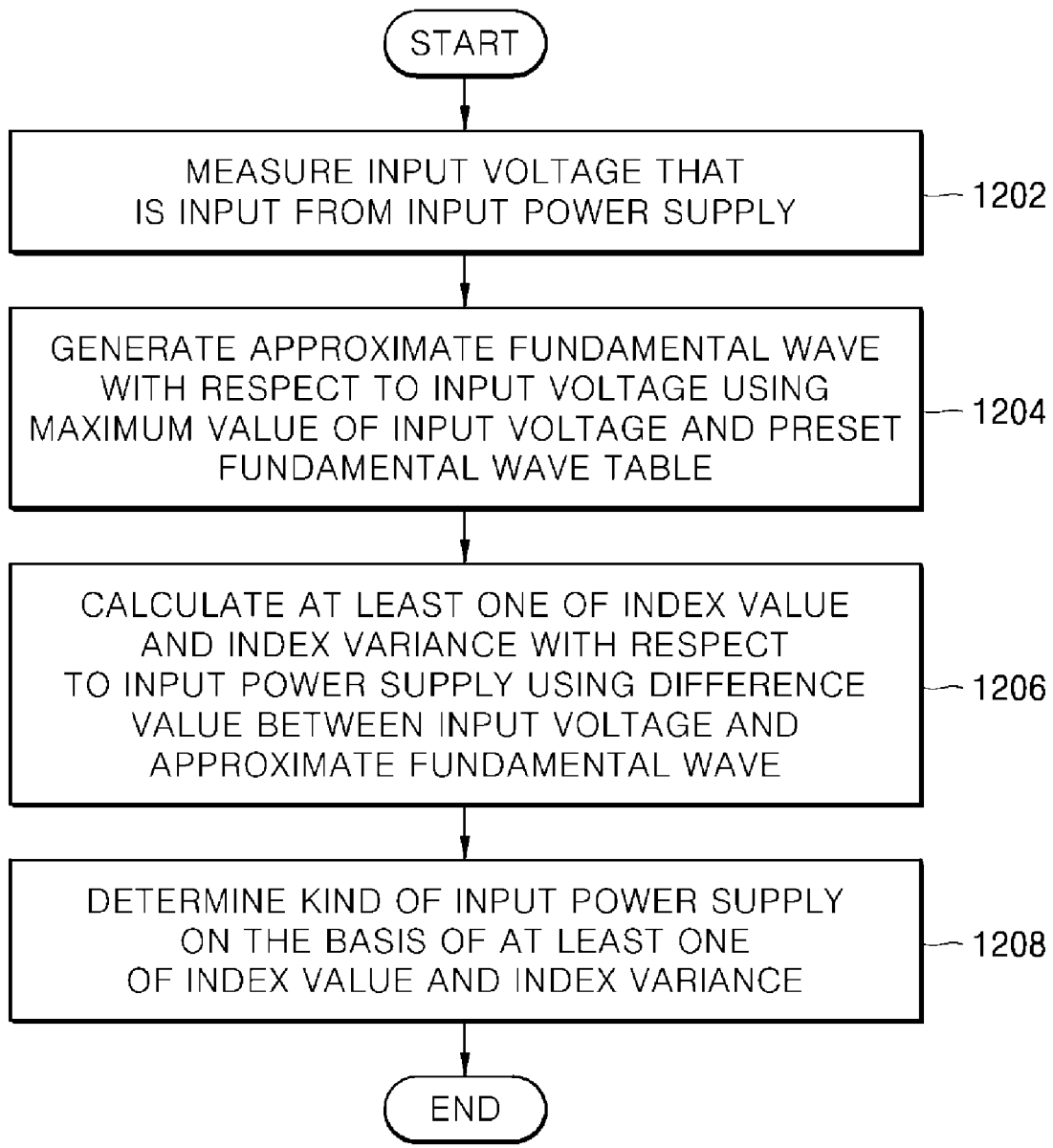

METHOD AND APPARATUS FOR MANAGING POWER SUPPLY OF ELECTRONIC DEVICE

CROSS-REFERENCE TO RELATED APPLICATION(S)

This application claims priority to and the benefit of Korean Patent Application No. 10-2016-0083688, filed on Jul. 1, 2016, the disclosure of which is incorporated herein by reference in its entirety.

BACKGROUND

1. Field

The present disclosure relates to a method and an apparatus for managing a power supply of an electronic device, and more particularly, to a method and an apparatus for accurately determining a kind of input power supply that supplies power to an electronic device.

2. Background

An uninterruptable power supply (UPS) is an apparatus for supplying emergency power to an electronic device when commercially supplied power is unavailable. For example, when a line voltage of the commercially supplied power varies beyond acceptable ranges or a supply of the commercially supplied power is interrupted, the UPS supplies stored power to the electronic device for a predetermined time to enable the electronic device to continue operating.

A UPS typically includes a rectifier, an inverter, and a battery charger. When commercially supplied power is available, the UPS converts a portion of a commercial alternating current (AC) power supply into a direct current (DC) to charge a battery. On the other hand, when the commercially supplied power is unavailable, the UPS converts the stored DC voltage of the battery into an AC voltage through a DC/AC inverter and provides the converted AC voltage to the electronic device.

An electronic device may determine whether received power is commercially supplied power or stored power from a UPS. For example, a type of power supply may be identified by extracting harmonics included in the input voltage, and calculating a magnitude of the extracted harmonics. However, a complicated calculation, such as a decimal point calculation, is typically used for the harmonic extraction and the magnitude calculation, such that using these calculations to identify the kind of power supply may take a long time and may require significant processing resources.

The conventional voltage source detection techniques, such as the above described process for identifying a kind of power supply using the harmonic extraction and the magnitude calculation, may be performed as one or more of the functions within a control cycle. A time for identifying a kind of power supply may become excessively long if the calculations are complex, and the calculations to identify the kind of power supply may not be completed within the control cycle. Consequently, the electronic device may still be performing the voltage source identifying calculations during a next control cycle.

In this situation, incorrect operation or a failure of the electronic device may occur because basic functions of the electronic device may not be performed during the current or the next control cycle while the electronic device is using resources to identify a type of power supply. Therefore, there is a need for technology which is capable of accurately and quickly identifying an input power supply source without affecting basic functions of an electronic device.

BRIEF DESCRIPTION OF THE DRAWINGS

Embodiments will be described in detail with reference to the following drawings in which like reference numerals refer to like elements, and wherein:

FIG. 8 is an example of a fundamental wave table to which the input power supply management apparatus refers to generate the approximate fundamental wave in one embodiment of the present disclosure;

FIG. 10 is a table illustrating index values and index variances which are measured when different kinds of commercially supplied power are used;

FIG. 11 is a table illustrating index values and index variances which are measured when different kinds of UPSs are used; and FIG. 12 is a flowchart illustrating a method for managing an input power supply of an electronic device according to one embodiment of the present disclosure.

DETAILED DESCRIPTION

Figure 1:
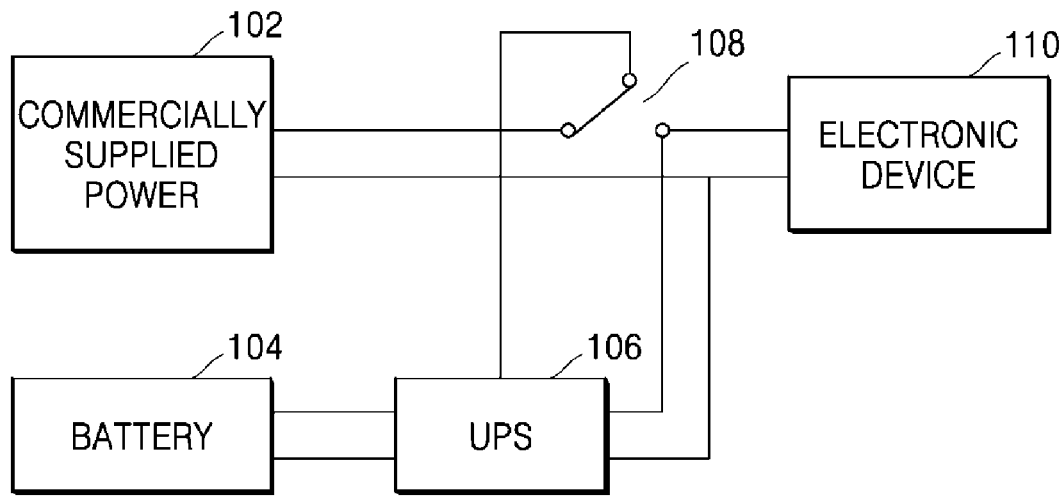
FIG. 1 is a diagram for describing a process of supplying power to an electronic device by commercially supplied power and an uninterruptable power supply (UPS) apparatus.

FIG. 1 is a diagram describing a process of supplying power to an electronic device 110 using commercially supplied power 102 and an uninterruptable power supply apparatus (UPS) 106. Referring to FIG. 1, when the commercially supplied power 102 is available, the electronic device 110 receives a portion of the commercially supplied power 102 and uses the received portion of the commercially supplied power 102 for operation. An UPS 106 also charges a battery 104 using another portion of the commercially supplied power 102.

When the commercially supplied power 102 is unavailable, a switching operation of a switch 108 uncouples the commercially supplied power 102 from the electronic device 110 and connects the UPS 106 and the battery 104 to the electronic device 110. Accordingly, power stored in the battery 104 is supplied to the electronic device 110 through UPS 106. The UPS generally provides the power stored in the battery, and there is a limit in an amount of power that the UPS can provide to the electronic device before the stored power in the battery 104 is depleted. Therefore, the electronic device 110 may include technology for determining whether the electronic device 110 is receiving commercially supplied power or stored power from the UPS.

Figure 2:
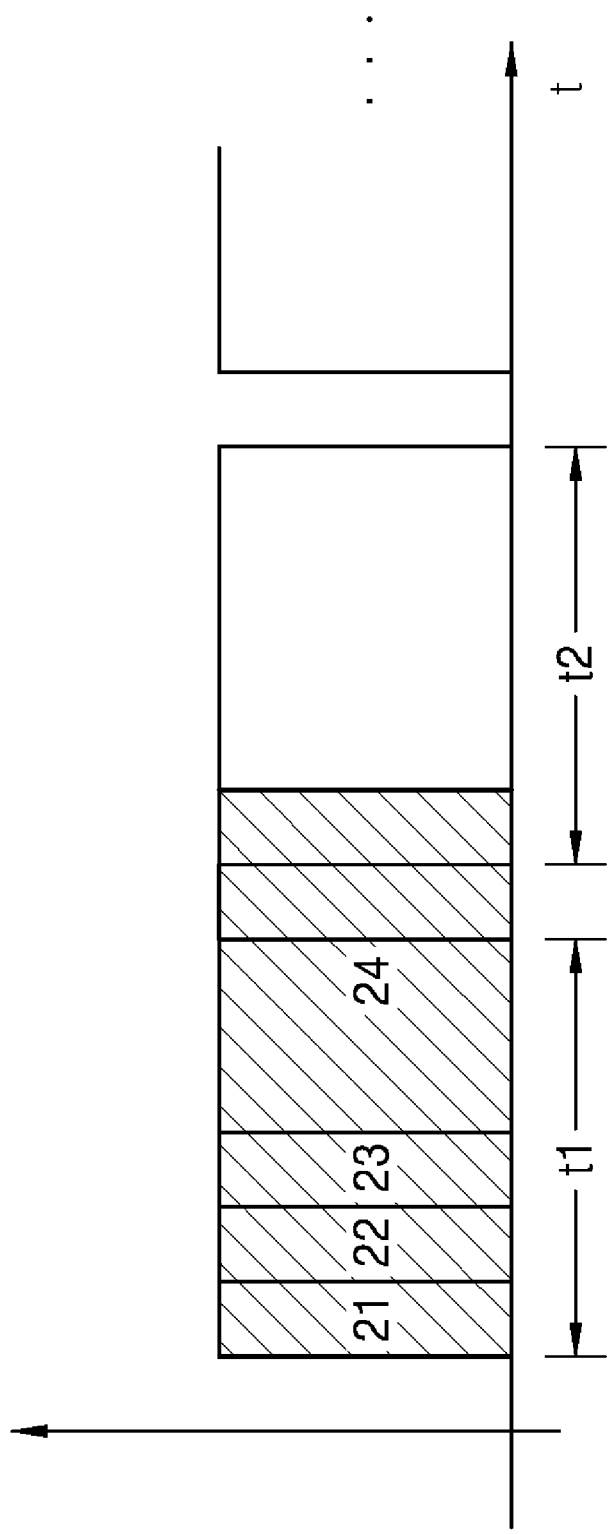
FIG. 2 is a graph illustrating a control cycle of the electronic device and a time required for determining a kind of input power supply.

FIG. 2 is a graph illustrating an example of a control cycle of an electronic device and a time required for determining a kind of power supply. As shown in FIG. 2, the electronic device may perform various functions during control periods t1, t2, ..., etc. For example, the electronic device sequentially perform each of a first function 21, a second function 22, and a third function 23 during one control cycle t1. A process for identifying a power supply source, such as using harmonic extraction and magnitude calculation, may be performed as one or more of the functions within the control cycle t1.

Using the conventional voltage source detection techniques, a time 24 for identifying a kind of power supply may become excessively long, and the calculations to identify the kind of power supply may not be completed within the one control cycle t1. Consequently, the electronic device may still be performing the voltage source identifying calculations during a next control cycle t2, that follows the one control cycle t1. In response, embodiments of the present disclosure may provide a methodology that allows an electronic device to identify whether power is received from a commercial power supply or from a UPS during a single control cycle (e.g., within control cycle t1) so that operations of the electronic device are not compromised during the next control cycle t2.

Figure 3:
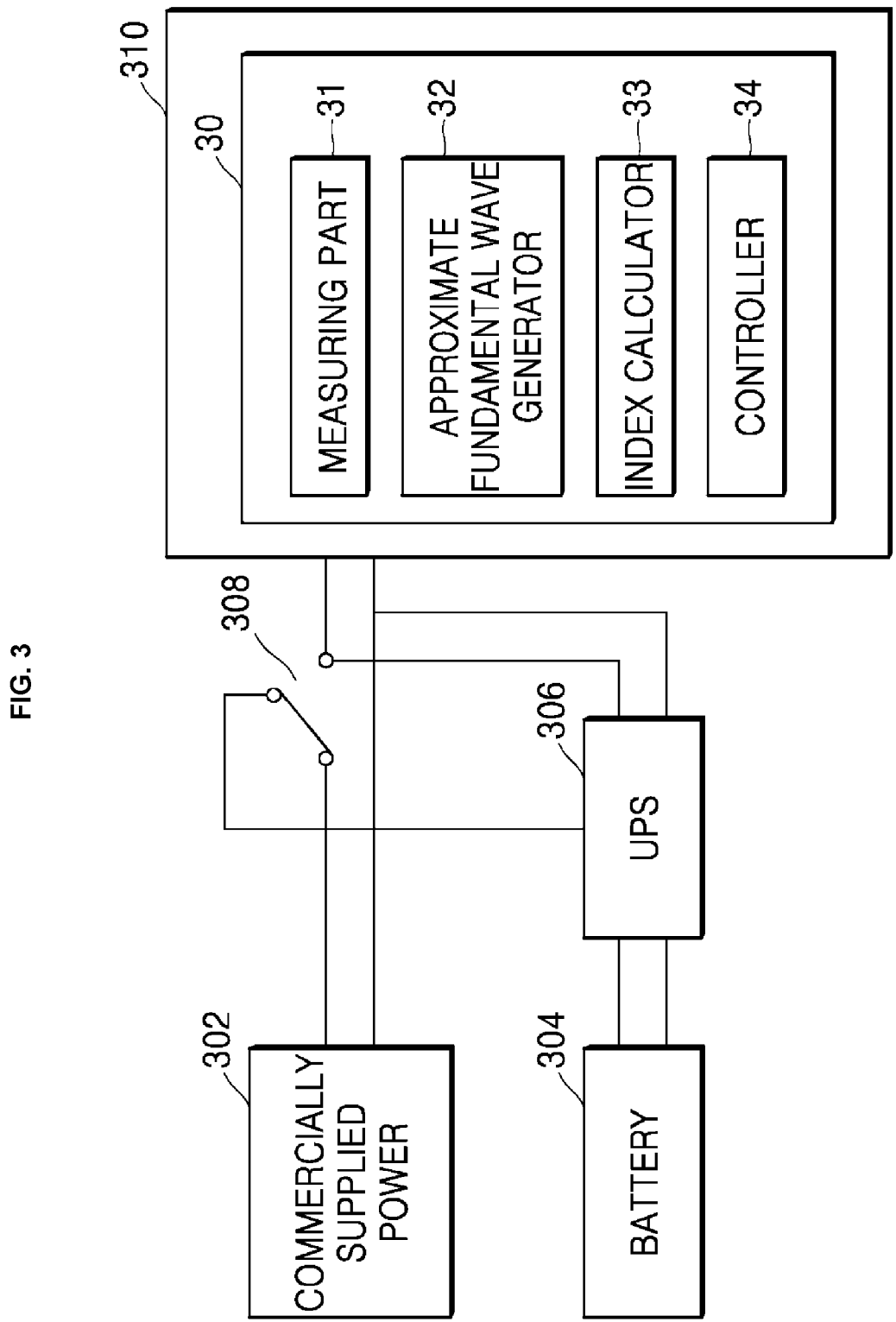
FIG. 3 is a configuration diagram of an input power supply management apparatus of an electronic device according to one embodiment of the present disclosure.

FIG. 3 is a configuration diagram of an input power supply management apparatus of an electronic device according to one embodiment of the present disclosure. Referring first to FIG. 3, an electronic device 310 receives power from a commercially supplied power 302 or an uninterruptable power supply apparatus (UPS) 306. When the commercially supplied power 302 is available, the electronic device 310 receives power through the commercially supplied power 302. However, when the commercially supplied power 302 is unavailable, a switch 308 performs a switching operation to uncouple the electronic device 310 from the commercially supplied power 302 and to activate the UPS 306. The UPS 306 converts power stored in a battery 304 and supplies the converted power to the electronic device 310.

The electronic device 310 illustrated in FIG. 3 is a device which is driven by electrical energy. Examples of the electronic device 310 may include an air conditioner, a refrigerator, a washing machine, a television (TV), a computer, and the like, but the electronic device 310 is not limited thereto.

An input power supply management apparatus (or circuitry) 30 determines whether the electronic device 310 is receiving power from the commercially supplied power 302 or the UPS 306, and then may control an operation of the electronic device 310 on the basis of the determined power source. In FIG. 3, the input power supply management apparatus 30 is illustrated to be included in the electronic device 310, but alternatively, the input power supply management apparatus 30 may be implemented as a separate device from the electronic device 310, according to other embodiments.

Figure 4:
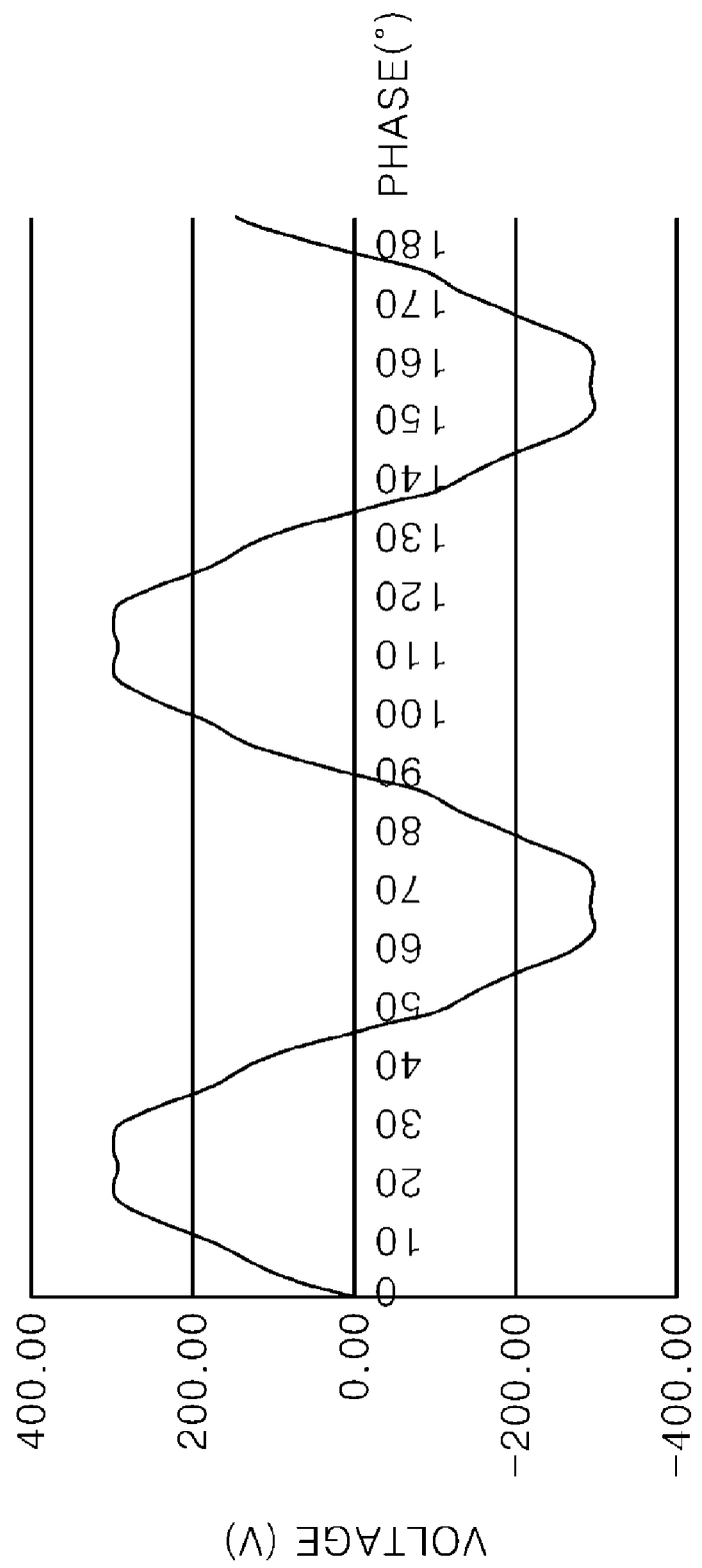
FIG. 4 is a waveform diagram of an input voltage that is input by the input power supply in one embodiment of the present disclosure.

Referring back to FIG. 3, the input power supply management apparatus 30 according to one embodiment of the present disclosure includes a measuring part (or sensor) 31, an approximate fundamental wave generator (or an approximate fundamental wave processor) 32, an index calculator (or an index processor) 33, and a controller (or a control processor) 34. The measuring part 31 measures an input voltage that is input to the electronic device 310 from an input power supply. In one embodiment of the present disclosure, the measuring part 31 may measure the input voltage according to a frequency of the input voltage or a cycle thereof to generate a waveform of the input voltage, as illustrated in FIG. 4 (described below).

Figure 5:
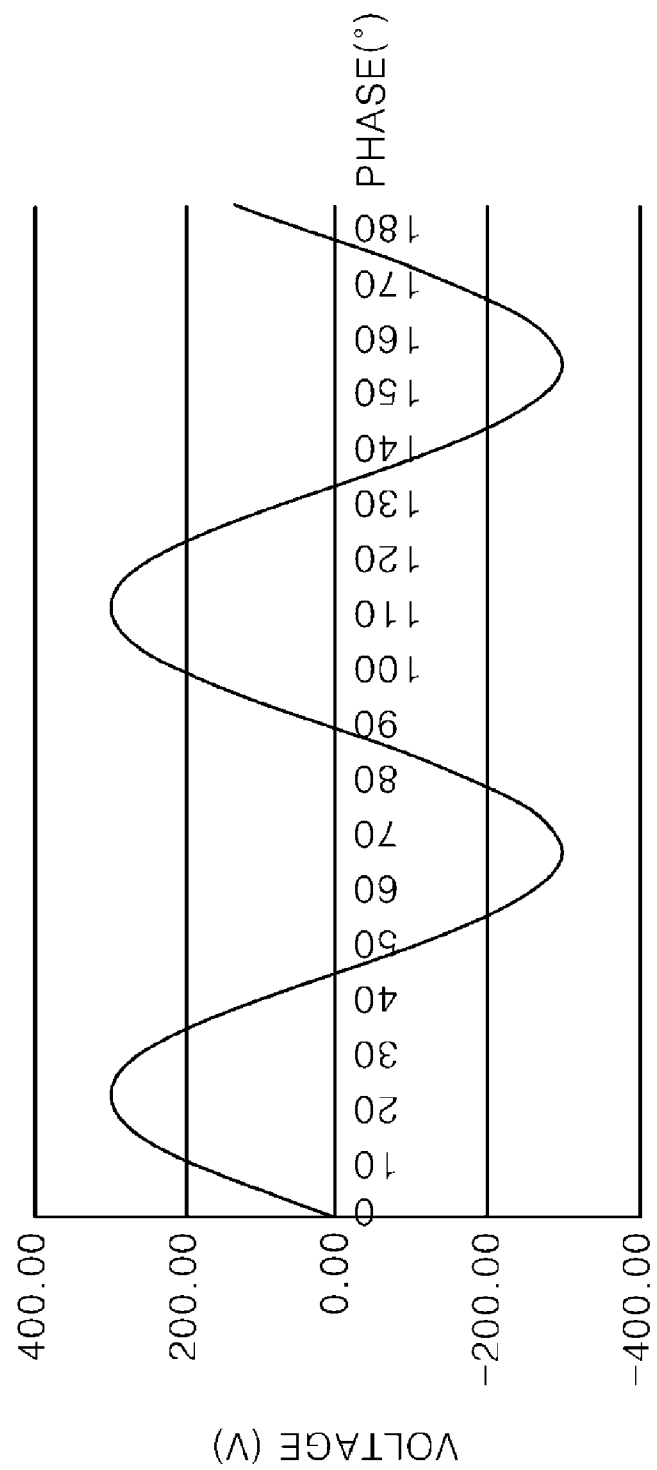
FIG. 5 is a waveform diagram of an approximate fundamental wave with respect to the input voltage, which is generated by the input power supply management apparatus in one embodiment of the present disclosure.

The approximate fundamental wave generator 32 generates an approximate fundamental wave with respect to the input voltage using a maximum, minimum, or other value of the input voltage, which is measured by the measuring part 31, and preset fundamental wave values, such as values stored in a fundamental wave table. The fundamental wave may correspond to a periodic function, such as a sine, cosine or other sinusoidal wave, and the fundamental wave table may store values for the periodic function at different angles or other intervals. In one embodiment of the present disclosure, the approximate fundamental wave generator 32 may determine a value of the input voltage corresponding to a preset phase as a maximum value. Also, the approximate fundamental wave generator 32 may calculate a reference interval with respect to values of fundamental wave (e.g., values in a fundamental wave table) using a measured frequency with respect to the input voltage, and a frequency of the input power supply. In addition, the approximate fundamental wave generator 32 may generate an approximate fundamental wave, as illustrated in FIG. 5 (described below) using a voltage value of the fundamental wave, which is determined with reference to the fundamental wave values according to the calculated reference interval and the maximum value. Thus, the approximate fundamental wave generator 32 may generate an artificial wave having similar amplitude, phase and frequency to the actual input voltage received by the electronic device 310, as detected by the measuring part 31.

The index calculator 33 calculates at least one of an index value or an index variance with respect to the input power supply using differences between the input voltage and the approximate fundamental wave. In one embodiment of the present disclosure, the index calculator 33 may calculate respective sums of differences value between the input voltage and the approximate fundamental wave over a preset number of cycles, and may determine one value among a minimum value, a maximum value, and an average value of the respective sums of the differences as the index value. Also, in one embodiment of the present disclosure, the index calculator 33 may calculate respective sums of differences value between the input voltage and the approximate fundamental wave over the preset number of cycles, and may determine a difference between two values among a minimum value, a maximum value, and an average value of the respective sums as an index variance.

Further, in one embodiment of the present disclosure, the index calculator 33 may calculate at least one of a load index value or a load index variance when the input voltage is used to drive one or more specific components of the electronic device 310, or an idle index value and an idle index variance when the input voltage is not used to drive the one or more specific components of the electronic device 310.

The controller 34 may identify a type of input power supply on the basis of at least one of the index value or the index variance, which are calculated by the index calculator 33. In one embodiment of the present disclosure, the controller 34 may identify the input power supply as the commercially supplied power 302 when at least one of the index value or the index variance is less than or equal to a preset reference value. Otherwise, controller 34 may identify the input power supply as the UPS 306 when at least one of the index value or the index variance is greater than a preset reference value.

Also, in one embodiment of the present disclosure, the controller 34 may determine the input power supply as the commercially supplied power 302 when at least one of a difference value between the load index value and the idle index value or a difference value between the load index variance and the idle index variance is less than or equal to a preset reference value. Otherwise, controller 34 may determine the input power supply as the UPS 306 when at least one of a difference value between the load index value and the idle index value or a difference value between the load index variance and the idle index variance is greater than the preset reference value.

Further, in one embodiment of the present disclosure, when the input power supply is identified as the UPS 306, the controller 34 may modify operation of the electronic device 310. For example, the controller 34 may cause the electronic device 310 to operate in a minimum power consumption mode by deactivating certain components (e.g., deactivating a display screen), and/or may control the electronic device 310 to perform other tasks or functions, such as storing settings or other data, before the stored power in battery of the UPS 306 is depleted.

Figure 6:
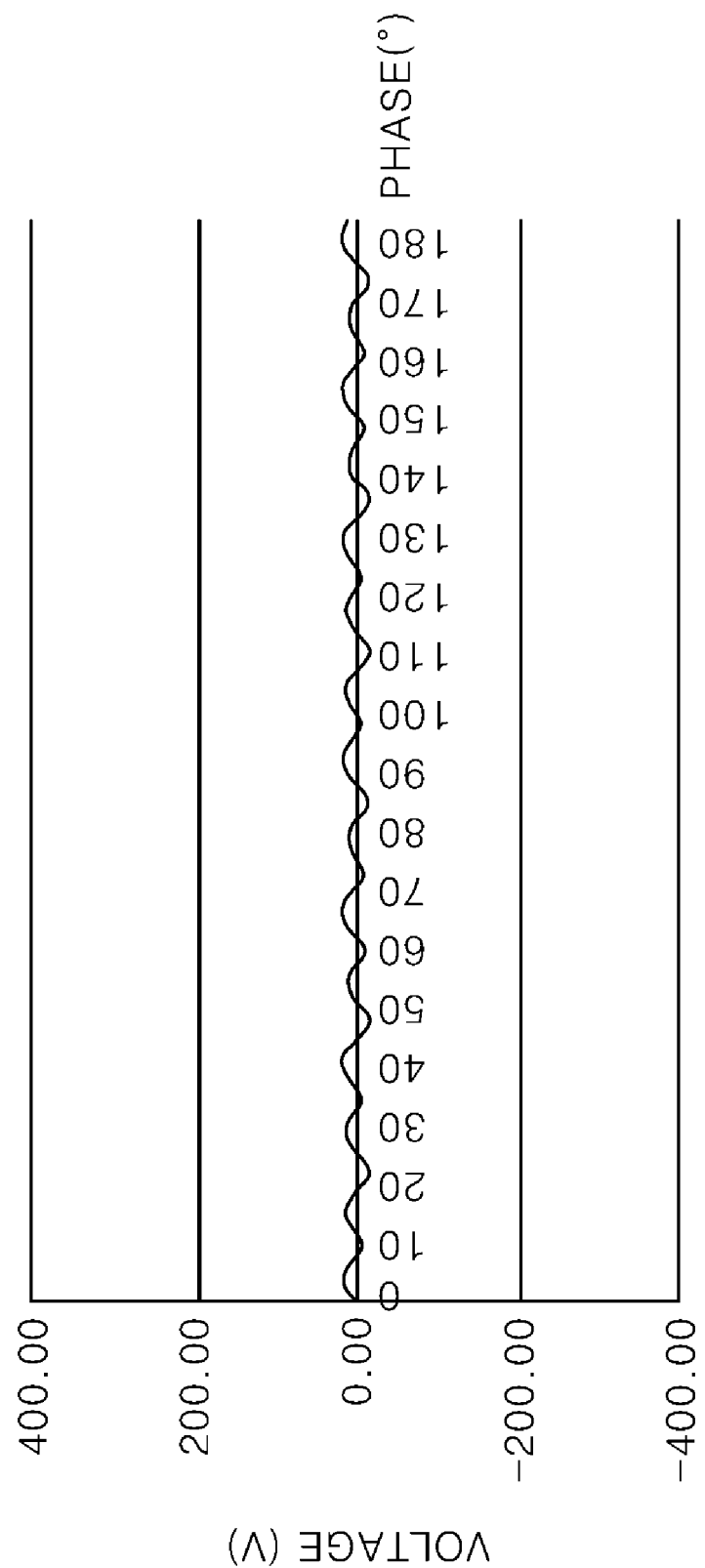
FIG. 6 is a waveform diagram illustrating a difference between the input voltage and the approximate fundamental wave in one embodiment of the present disclosure.

FIG. 4 is a waveform diagram of an input voltage that is input by the input power supply in one embodiment of the present disclosure, and FIG. 5 is a waveform diagram of an approximate fundamental wave with respect to the input voltage, which is generated by an input power supply management apparatus in one embodiment of the present disclosure. Further, FIG. 6 is a waveform diagram illustrating a difference between the input voltage and the approximate fundamental wave in one embodiment of the present disclosure.

The input power supply management apparatus 30 according to the present disclosure generates the approximate fundamental wave as illustrated in FIG. 5 on the basis of the input voltage that is measured, as illustrated in FIG. 4. Thereafter, the input power supply management apparatus 30 calculates a difference value between the input voltage of FIG. 4 and the approximate fundamental wave of FIG. 5, and calculates at least one of an index value or an index variance on the basis of the calculated difference value. In accordance with the present disclosure, an input voltage that is input by the commercially supplied power 302 and an input voltage that is input by the UPS 306 may be associated with different characteristics, and such different characteristic of the input voltages from the commercially supplied power 302 and the UPS 306 may be reflected to the index value and the index variance. Accordingly, the input power supply management apparatus 30 according to the present disclosure may identify a type of the input power supply on the basis of at least one of the index value or the index variance, which may be calculated as described above.

Hereinafter, a method for managing an input power supply of the input power supply management apparatus according to one embodiment of the present disclosure will be described in detail with reference to FIGS. 3 to 11. First, the measuring part 31 measures an input power supply, that is, an input voltage that is supplied to the electronic device 310 by the commercially supplied power 302 or the UPS 306. The measuring part 31 may generate a waveform of the measured input voltage as illustrated in FIG. 4.

Next, the approximate fundamental wave generator 32 generates the approximate fundamental wave with respect to the input voltage as illustrated in FIG. 5 using the measured input voltage by the measuring part 31, and preset fundamental wave values, such as those stored in a preset fundamental wave table. As used herein, the approximate fundamental wave is an artificial wave generated by approximate fundamental wave generator 32 to have a similar maximum amplitude and phase as the measured input voltage In one embodiment of the present disclosure, the approximate fundamental wave generator 32 may generate the approximate fundamental wave according to the following Equation 1:

$$\text{Value for Approximate fundamental wave at } \theta_n = V_{in\_max} \times \text{Sin } \theta_n \quad \text{[Equation 1]}.$$

In Equation 1, $V_{in\_max}$ refers to a maximum value of an input voltage detected by measuring part 31, $\theta_n$, refers to an n-th phase angle, and Sin $\theta_n$ may correspond to entry in a preset fundamental wave table for a sine function corresponding to that phase $\theta_n$.

Figure 7:
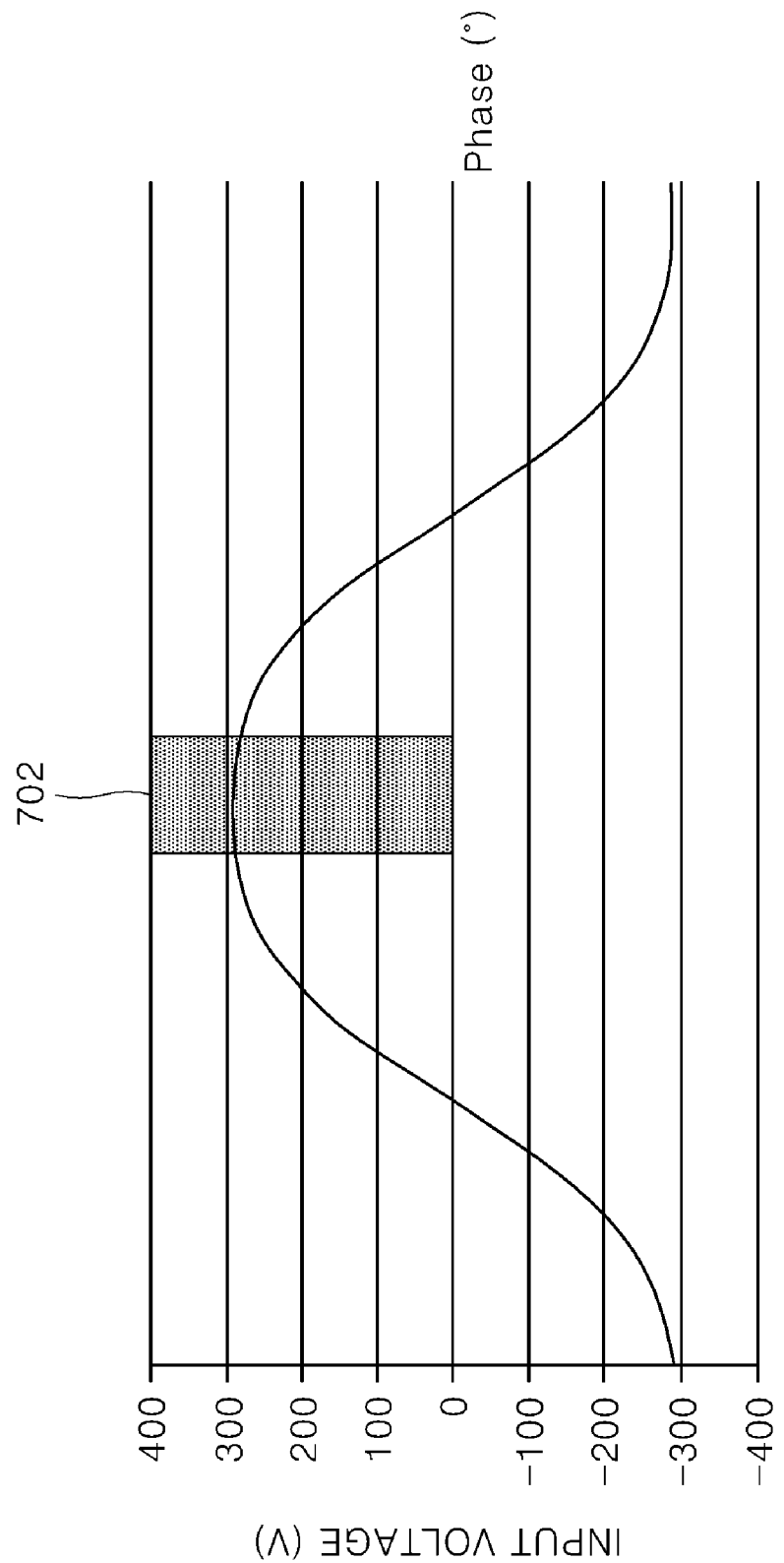
FIG. 7 is a waveform diagram of an input voltage measured by the input power supply management apparatus to generate an approximate fundamental wave in one embodiment of the present disclosure.

The approximate fundamental wave generator 32 first determines a maximum input voltage value in a preset phase range of input voltage values for one cycle, which are measured by the measuring part 31, as a maximum value. For example, when an input voltage value measured by the measuring part 31 is represented as a waveform that is similar to a sine wave, the approximate fundamental wave generator 32 may determine an input voltage value when a phase is 90 degrees as a maximum value. In another embodiment, as illustrated in FIG. 7, the approximate fundamental wave generator 32 may determine a maximum input voltage value of input voltage values in a phase range 702 when a phase is between 85 and 95 degrees as a maximum value. The phase range 702 for use in determining a maximum input voltage value may be differently set according to different embodiments.

Next, the approximate fundamental wave generator 32 determines a reference phase for use in generating an approximate fundamental wave. The approximate fundamental wave is generated on the basis of the input voltage, and particularly, the fundamental wave may be generated within a cycle similar to (e.g. with a 10 percent difference) of the cycle of the input voltage so as to calculate a difference value between the approximate fundamental wave and the input voltage. Accordingly, the approximate fundamental wave generator 32 determines the reference phase on the basis of the input voltage, and generates the approximate fundamental wave on the basis of the determined reference phase. In one embodiment of the present disclosure, the approximate fundamental wave generator 32 may determine a phase corresponding to a zero crossing point, that is, a phase when the input voltage is 0 as the reference phase.

Next, the approximate fundamental wave generator 32 may calculate a reference interval with respect to the fundamental wave table using a measured frequency with respect to the input voltage and a frequency of the input power supply. Here, the measured frequency with respect to the input voltage refers to the number of times the input power supply management apparatus 30 measures the input voltage per unit hour. Therefore, the reciprocal of the measured frequency with respect to the input voltage becomes a measurement cycle of the input voltage. For example, when a measured frequency is 4.5 kilohertz (kHz) (or cycles per second), a measurement cycle becomes 220 microseconds (μs) (1 sec./4.5 kHZ).

Also, the frequency of the input power supply refers to a frequency of an input power supply of the commercially supplied power 302 or the UPS 306, which supplies power to the electronic device 310. For example, a frequency of the commercially supplied power 302 may be 50 Hz, and in this case of the power frequency of 50 Hz (or cycles per second), a cycle of the input power supply becomes 20 milliseconds (ms) (1 sec./50 HZ).

The approximate fundamental wave generator 32 calculates the number pulse width modulation (PWM) events by dividing the measured frequency with respect to the input voltage by the frequency of the input power supply. For example, when a measured frequency with respect to the input voltage is 4.5 kHz and a frequency of the input power supply is 50 Hz, the number of PWM events is 4500/50=90. Here, the number of the PWM events may be a number of different phases values used by the fundamental wave generator 32 to generate the approximate fundamental wave and may refer to the number of times the fundamental wave table is accessed to generate one cycle of an approximate fundamental wave (e.g., the number of simulated values between two peak voltage values of the fundamental wave). For example, when the number of the PWM events is 90, the approximate fundamental wave generator 32 generates an approximate fundamental wave using 90 fundamental wave voltage values, which may be obtained by referring to the fundamental wave table or may be dynamically calculated using, for example, Equation 1 or a similar equation for other types of periodic wave functions.

Next, the approximate fundamental wave generator 32 calculates a reference interval with respect to the fundamental wave table on the basis of the calculated number of the PWM events and the number of pieces of data of the fundamental wave table. In one embodiment of the present disclosure, the reference interval is calculated by dividing the number of pieces of data of the fundamental wave table by the number of the PWM events.

FIG. 8 is an example of the fundamental wave table to which the input power supply management apparatus 30 may access when generating the approximate fundamental wave in one embodiment of the present disclosure. For example, when the fundamental wave is set to a sine wave, as illustrated in FIG. 8, one cycle phase (that is, 360 degrees) of the sine wave may be divided into 1024 phase or angular sections, and a fundamental wave voltage value corresponding to each of the 1024 phases may be stored as a fundamental wave table. In this case, 1024/90=11.37 is the established desired number of entries between fundamental table entry values, so that the approximate fundamental wave generator 32 may set a reference interval to 11 or 12. For example, when the reference interval is set to 11 and a reference phase is $\theta_1$, the approximate fundamental wave generator 32 may refer to a fundamental wave voltage value corresponding to every eleven entries (e.g., the entries for Sin $\theta_1$, Sin $\theta_{12}$, Sin $\theta_{23}$, etc.) in the example of the fundamental wave table shown in FIG. 8.

Figure 9:
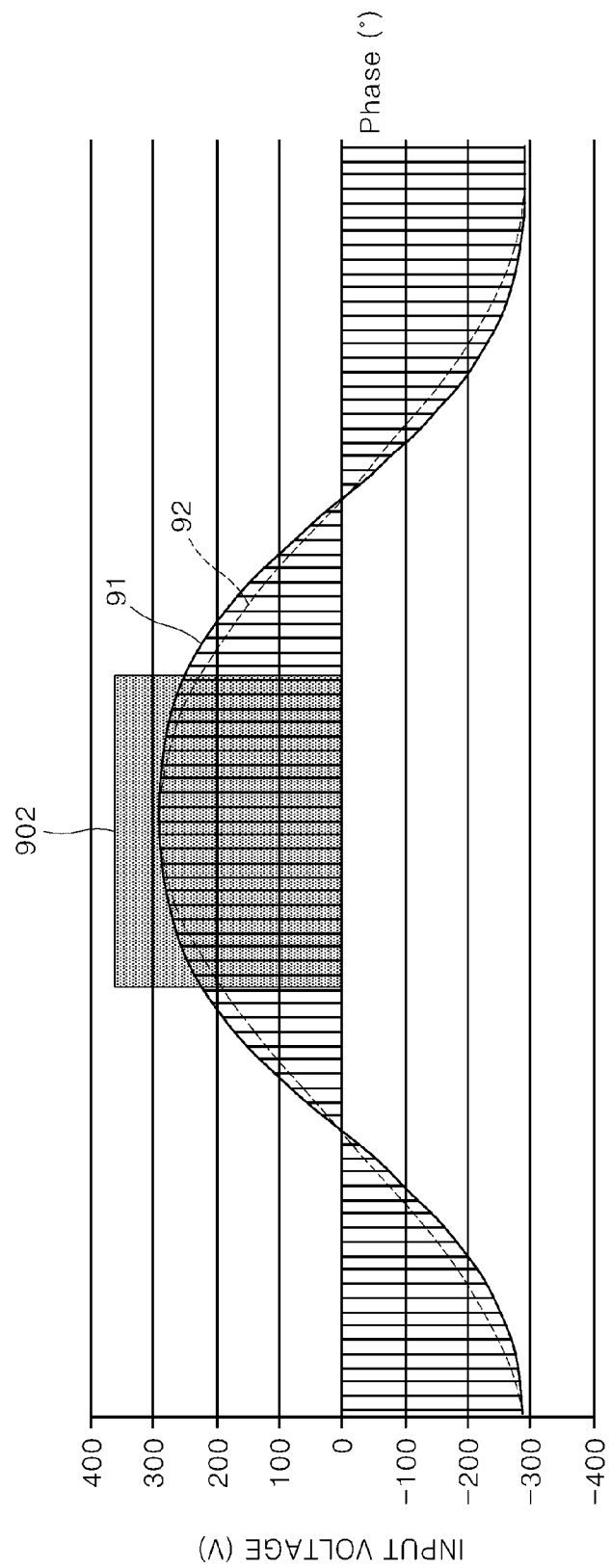
FIG. 9 is waveform diagrams of the approximate fundamental wave which is generated by the input power supply management apparatus, and the input voltage in one embodiment of the present disclosure.

When the fundamental wave voltage values which will be used to generate the approximate fundamental wave are determined with reference to the fundamental wave table through the above described process, the approximate fundamental wave generator 32 generates the approximate fundamental wave on the basis of resultant voltage values which are generated by multiplying a maximum value that is calculated prior to each of the fundamental wave voltage values, as expressed in Equation 1. FIG. 9 illustrates waveforms of an approximate fundamental wave 92 and an input voltage 91 which are generated using 90 resultant voltage values in total through the described above process.

Next, the index calculator 33 calculates a difference value between the input voltage 91 and the approximate fundamental wave 92 which are generated as illustrated in FIG. 9. Here, the difference value refers to an absolute value of a difference between the input voltage 91 and the approximate fundamental wave 92. As illustrated in FIG. 9, the index calculator 33 may calculate each difference value between the input voltage 91 and the approximate fundamental wave 92 with respect to one entire cycle or a specific section 902 within one cycle. The index calculator 33 adds up each of the calculated difference values which are generated as described above between the input voltage 91 and the approximate fundamental wave 92 with respect to one cycle. In another embodiment of the present disclosure, the index calculator 33 may calculate a sum of a square of each difference value between the input voltage 91 and the approximate fundamental wave 92.

The index calculator 33 calculates the above-described sum of each of the difference values (or the above-described sum of the squares thereof) between the input voltage 91 and the approximate fundamental wave 92 a preset number of repetition times, such as over a preset number of cycles or portions of cycles. For example, when the preset number of repetition times is 10 the index calculator 33 repeats the above-described process over 10 cycles to calculate 10 sums of each of the difference values (or 10 sums of the squares thereof) between the input voltage 91 and the approximate fundamental wave 92.

The index calculator 33 determines one value of a minimum value, a maximum value, and an average value among the plurality of sums which are calculated over the preset number of cycles, as described above, as an index value. For example, the index calculator 33 may determine a smallest value among the 10 sums of the difference values (or the 10 sums of the squares thereof) between 10 cycles of the input voltage 91 and the approximate fundamental wave 92 as the index value.

Also, the index calculator 33 may determine a difference between two values of the minimum value, the maximum value, and the average value among the plurality of sums which are calculated as described above as an index variance with respect to the input voltage. For example, the index calculator 33 may determine an absolute value of a difference between the minimum value and the maximum value among the 10 sums of the difference values (or the 10 sums of the squares thereof) between 10 cycles the input voltage 91 and the approximate fundamental wave 92 as the index variance with respect to the input voltage. Also, the index calculator 33 may determine an absolute value of a difference between the minimum value and the average value among the 10 sums of each of the difference values (or the 10 sums of the squares thereof) between the input voltage 91 and the approximate fundamental wave 92 as the index variance with respect to the input voltage.

Further, in one embodiment of the present disclosure, the index calculator 33 may calculate a load index value and a load index variance when the input voltage that is input from the input power supply is used to drive a specific component of the electronic device 310 (e.g., when the electronic device 310 is active). In an example that the electronic device 310 is an air conditioner, the index calculator 33 may calculate an index value and an index variance when the input voltage that is input from the input power supply is used to drive a compressor of the air conditioner. When the input voltage is used to drive a specific component or a load as described above, the calculated index value and the calculated index variance may be referred to as the load index value and the load index variance.

Further, in one embodiment of the present disclosure, the index calculator 33 may calculate an idle index value and an idle index variance when the input voltage that is input from the input power supply is not used to drive a specific component of the electronic device 310 (e.g., when the electronic device 310 is inactive). For example, when the electronic device 310 is an air conditioner, the index calculator 33 may calculate an index value and an index variance when the input voltage that is input from the input power supply is not used to drive a compressor of the air conditioner. When the input voltage is not used to drive a specific component or a load as described above, the calculated index value and the calculated index variance may be referred to as the idle index value and the idle index variance.

Next, the controller 34 determines a kind of the input power supply on the basis of at least one of the index value or the index variance, which are calculated by the index calculator 33. In one embodiment of the present disclosure, the controller 34 may identify the input power supply as commercially supplied power 302 when at least one of the index value and the index variance is less than or equal to a preset reference value. Otherwise, the controller 34 may identify the input power supply as a UPS 306 when at least one of the index value and the index variance is greater than the preset reference value.

Also, in one embodiment of the present disclosure, the controller 34 may identify the input power supply as the commercially supplied power 302 when at least one of a difference value between the load index value and the idle index value or a difference value between the load index variance and the idle index variance is less than or equal to a preset reference value. Otherwise, the controller 34 may identify the input power supply as the UPS when at least one of the difference value between the load index value and the idle index value or the difference value between the load index variance and the idle index variance greater than the preset reference value.

Hereinafter, an input power supply determination criterion by the controller 34 will be described in detail with reference to FIGS. 10 to 11. FIG. 10 is a table illustrating index values and index variances which are measured when different kinds of commercially supplied power are used, and FIG. 11 is a table illustrating index values and index variances which are measured when different kinds of UPSs are used.

In one example, a hypothetical commercially supplied power is illustrated in FIG. 10 as having an idle index value of 80, and load index values with respect to 20 W and 50 W of 94 and 99. Also, a hypothetical UPS (5) is illustrated in FIG. 11 as having an idle index value of 290 and load index values with respect to 20 W and 50 W of 405 and 740. If a reference value for an index value is set to 200, the controller 34 may identify the power supply (1), which has idle and load index values less than or equal to 200, as commercially supplied power, and may identify the power supply (5), which has idle and load index values exceeding 200, as a UPS.

As another example, in hypothetical commercially supplied power (2) is illustrated in FIG. 10 as having an idle index variance of 8 and load index variances with respect to 20 W and 50 W of 9 and 9. Also, a hypothetical UPS (7) is illustrated in FIG. 11 as having an idle index variance of 60 and load index variances with respect to 20 W and 50 W of 62 and 65. If a reference value with respect to an index variance is set to 30, the controller 34 may identify the power supply (2), which has index variance values less than or equal to 30 as commercially supplied power, and may identify the power supply (7), which has index variance values exceeding 30, as a UPS.

In the two above-described examples, the controller 34 is described to determine the kind of input power supply on the basis of only one of the index value or the index variance. Alternatively, however, the controller 34 may identify the kind of input power supply on the basis of whether both the index value and the index variance satisfy preset reference values (e.g., a reference index value and a reference variance). In yet another example, the controller 34 may identify a kind of input power supply on the basis of at least one of the idle index value or the load index value satisfy preset reference values.

As still another example, in the case of the hypothetical commercially supplied power (2) illustrated in FIG. 10, the differences between an idle index value (81) and load index values at 20 W (80) and at 50 W (86) are, respectively, 1 and 5. Also, in the case of a hypothetical UPS (6) illustrated in FIG. 11, the differences between an idle index value (3900) and load index values at 20 W (3660) and at 50 W (3378) are, respectively, 240 and 522. When a reference value with respect to a difference value between an idle index value and a load index value is set to 50, the controller 34 may identify the power supply (2), which has the idle index value and the load index values that are differ by less than or equal to 50, as commercially supplied power, and may identify a power supply (6), which has the idle index value and the load index values that differ by more than 50, as a UPS.

As yet another example, in the case of a hypothetical commercially supplied power (3) illustrated in FIG. 10, differences between an idle index variance (11) and load index variances at 20 W (10) and 50 W (11) are, respectively, 1 and 0. In contrast, in the case of a hypothetical UPS (4) illustrated in FIG. 11, differences between an idle index variance (18) and load index variances at 20 W (50) and at 50 W (70) are, respectively, 32 and 52. When a reference value with respect to a difference value between an idle index variance and a load index variance is set to 10, the controller 34 may identify the power supply (3), which has differences between the idle index variance and the load index variances that are less than or equal to 10, as commercially supplied power, and may identify the power supply (4), which has differences between the idle index variance and the load index variances that exceed 10, as a UPS.

In the two above-described examples, the controller 34 is described as identifying the kind of input power supply on the basis of one of the differences between the idle index value and the load index values satisfying a first preset reference value or the differences between the idle index variance and the load index variances satisfying a second preset reference value. Alternatively, the controller 34 may identify the kind of input power supply on the basis of whether both the differences between the idle index value and the load index values satisfy the first preset reference value, and the differences between the idle index variance and the load index variances satisfy the second preset reference value.

When the input power supply is identified as the UPS 306, the controller 34 may control the electronic device 310 to operate in a particular manner or to perform certain functions. For example, 34 may control the electronic device 310 to operate in a minimum power consumption mode. For instance, the controller 34 may control the electronic device 310 to output a minimum level, or control the electronic device 310 to perform a minimum function for maintaining a basic function of the electronic device 310. As is described above, in an amount of power that can supplied by the UPS 306 is limited (e.g., by the capacity of battery 304), and operating at the minimum power mode may extend a time that electronic device 310 may operate when supplied by UPS 306.

FIG. 12 is a flowchart illustrating a method for managing an input power supply of an electronic device according to one embodiment of the present disclosure Referring to FIG. 12, an input power supply management apparatus (such as input power supply management apparatus 30) measures an input voltage that is input from an input power supply in Block 1202. In one embodiment of the present disclosure, the input power supply management apparatus may generate a waveform of the measured input voltage, as illustrated in FIG. 4, that shows different voltage levels supplied to an electronic device during different phases.

Continuing with FIG. 12, the input power supply management apparatus generates an approximate fundamental wave with respect to the input voltage on the basis of a maximum value of the input voltage and a preset fundamental wave table in Block 1204. In one embodiment of the present disclosure, Block 1204 of generating the approximate fundamental wave may include determining a maximum input voltage value within a preset phase range as a maximum value, calculating a reference interval with respect to the fundamental wave table using a measured frequency with respect to the input voltage and a frequency of the input power supply, and generating the approximate fundamental wave using a voltage value of the fundamental wave, which is determined with reference to the fundamental wave table according to the reference interval and the maximum value. Although generating the approximate fundamental wave in Block 1204 is described as being performed by using a preset fundamental wave table storing values for a fundamental wave, it should be appreciated that the values for a fundamental wave may be dynamically generated (e.g., using Equation 1) or otherwise identified without using a preset fundamental wave table.

As depicted in FIG. 12, the input power supply management apparatus calculates at least one of an index value or an index variance with respect to the input power supply using differences between the input voltage and the approximate fundamental wave in Block 1206. In one embodiment of the present disclosure, Block 1206 of calculating at least one of the index value or the index variance may include calculating sums of differences between the input voltage and the approximate fundamental wave over a preset number of cycles, and determining one value among a minimum value, a maximum value, or an average value of the respective sums of the differences which are calculated over the preset number of cycles as an index value.

In another embodiment of the present disclosure, Block 1206 of calculating at least one of the index value or the index variance may include calculating respective sums of differences between the input voltage and the approximate fundamental wave over a preset number of cycles, and determining a difference between two values among a minimum value, a maximum value, or an average value of the respective sums of the differences which are calculated over the preset number cycles as an index variance.

Further, in yet another embodiment of the present disclosure, Block 1206 of calculating at least one of the index value or the index variance may include calculating a load index value and a load index variance when the input voltage is used to drive at least one specific component of the electronic device, and calculating an idle index value and an idle index variance when the input voltage is not used to drive the at least one specific component of the electronic device.

As depicted in FIG. 12, the input power supply management apparatus identifies the input power supply on the basis of at least one of the calculated index value or the calculated index variance in Block 1208. In one embodiment of the present disclosure, Block 1208 of identifying the input power supply may include identifying the input power as commercially supplied power when at least one of the index value or the index variance is less than or equal to a preset reference value, and otherwise, identifying the input power as converted stored power provided by a UPS when at least one of the index value or the index variance is greater than the preset reference value.

In another embodiment of the present disclosure, Block 1208 of identifying the input power supply may include identifying the input power as the commercially supplied power when at least one of a difference between the load index value and the idle index value or a difference between the load index variance and the idle index variance is less than or equal to a preset reference value. Otherwise, the input power may be identified as converted power received from the UPS when at least one of the difference between the load index value and the idle index value or the difference between the load index variance and the idle index variance is greater than a preset reference value.

Although not illustrated in FIG. 12, the method for managing an input power supply of an electronic device according to one embodiment of the present disclosure may further include controlling the operation of the electronic device based on the identified input power supply. For example, the electronic device may be controlled to operate in a minimum power consumption mode when the input power supply is determined as a UPS. In another example, the electronic device may be controlled to perform one or more actions when the input power supply is determined as a UPS, such as outputting or forward a notification to a user.

In other examples, the process depicted in FIG. 12 may be used to identify different types of input power supplies that differ from a commercial power source or a UPS, to identify one of multiple commercial power sources supplying input power, or identify one of multiple UPS devices supplying input power.

In accordance with the present disclosure as described above, the input power supply may be identified in a relatively short time without affecting controlling of basic functions of an electronic device. Also, in accordance with the present disclosure, the power supply may accurately be identified using an approximate fundamental wave which is generated on the basis of an input voltage that is input by the input power supply.

Aspects of the present disclosure provide a method and an apparatus for managing an input power supply of an electronic device, which are capable of accurately determining a kind of input power supply in a short time so as not to affect controlling of basic functions of an electronic device. Also, aspects of the present disclosure provide a method and an apparatus for managing an input power supply of an electronic device, which are capable of accurately determining a kind of input power supply using an approximate fundamental wave which is generated on the basis of an input voltage that is input by the input power supply.

Aspects of the present disclosure are not limited to the above described aspects, and other aspects of the present disclosure, which are not mentioned, can be understood by the following description and also will be apparently understood through embodiments of the present disclosure. It is also to be easily understood that the aspects of the present disclosure may be realized and attained by means and a combination thereof described in the appended claims.

A method for determining a kind of input power supply according to the related art requires a complicated calculation such as a decimal point calculation such that determining of the kind of power supply takes a long time. The present disclosure generates an approximate fundamental wave on the basis of an input voltage to reduce such a time required for determining the kind of input power supply. In the present disclosure, the kind of input power supply is determined on the basis of an index value that is generated according to a difference between the approximate fundamental wave generated as described above and an input voltage such that a time for determining the kind of input power supply may dramatically be reduced since complicated calculations are not used.

A method according to one embodiment of the present disclosure includes measuring an input voltage that is input from an input power supply to an electronic device; generating an approximate fundamental wave with respect to the input voltage using a maximum value of the input voltage and values of a fundamental wave, such as values stored in a preset fundamental wave table; calculating at least one of an index value or an index variance with respect to the input power supply using a difference between the input voltage and the approximate fundamental wave; and identifying a type of the input power supply based on the at least one of the index value or the index variance.

Also, an apparatus according to one embodiment of the present disclosure includes a measuring sensor configured to measure an input voltage that is input from an input power supply to an electronic device; an approximate fundamental wave processor configured to generate an approximate fundamental wave with respect to the input voltage using a maximum value of the input voltage and values for a fundamental wave; an index processor configured to calculate at least one of an index value or an index variance with respect to the input power supply using a difference between the input voltage and the approximate fundamental wave; and a controller configured to identify a type of the input power supply based on the at least one of the index value or the index variance.

It should be understood that various substitutions, modifications, and alternations can be derived by those skilled in the art without departing from the technical spirit of the present disclosure and the present disclosure is not limited to the above described embodiments and the accompanying drawings.

Any reference in this specification to "one embodiment," "an embodiment," "example embodiment," etc., means that a particular feature, structure, or characteristic described in connection with the embodiment is included in at least one embodiment of the disclosure. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method comprising:
    measuring an input voltage from an input power supply to an electronic device;
    generating a fundamental wave based on a maximum value of the input voltage and preset fundamental wave values;
    calculating at least one of an index value or an index variance with respect to the input power supply using one or more differences between the input voltage and the fundamental wave; and
    identifying a type of the input power supply based on the at east one of the index value or the index variance.

2. The method of claim 1, wherein the generating of the fundamental wave includes:
    determining a maximum input voltage value within a preset phase range as a maximum value;
    calculating a reference interval with respect to a fundamental wave table storing the values for the fundamental wave using a measurement frequency of the input voltage and a frequency of the input power; and
    generating the fundamental wave using a voltage value, which is determined with reference to the fundamental wave table, according to the reference interval and the maximum input voltage value.

3. The method of claim 1, wherein the calculating of the at least one of the index value or the index variance includes:
    calculating respective sums of differences between the input voltage and the fundamental wave at different phases within each of a preset number of cycles of the input voltage; and
    determining one of a minimum value, a maximum value, or an average value of the respective sums of the differences for the preset number of cycles as the index value.

4. The method of claim 1, wherein the calculating of the at least one of the index value or the index variance includes:
    calculating respective sums of differences between the input voltage and the fundamental wave at different phases within each of a preset number of cycles of the input voltage; and
    determining a difference between two values among a minimum value, a maximum value, or an average value of the respective sums as the index variance.

5. The method of claim 1, wherein the identifying of the type of the input power supply includes:
    identifying the input power supply as a commercially supplied power source when the at least one of the index value or the index variance is less than or equal to respective preset reference values, and identifying the input power supply as an uninterruptable power supply (UPS) when the at least one of the index value or the index variance is greater than the respective preset reference values.

6. The method of claim 1, wherein the calculating of the at least one of the index value or the index variance includes:

calculating a load index value and a load index variance when the input voltage is used to drive a specific component of the electronic device; and calculating an idle index value and an idle index variance when the input voltage is not used to drive a specific component of the electronic device.

7. The method of claim 6, wherein the identifying of the type of the input power supply includes:

identifying the input power supply as a commercially supplied power source when at least one of a difference between the load index value and the idle index value or a difference between the load index variance and the idle index variance is less than or equal to a preset reference value, and identifying the input power supply as a UPS when the at least one of the difference between the load index value and the idle index value or the difference between the load index variance and the idle index variance is greater than the preset reference value.

8. The method of claim 1, further comprising:

when the input power supply is identified as the UPS, controlling the electronic device to operate in a minimum power consumption mode.

9. The method of claim 1, wherein the generating of the fundamental wave includes determining the fundamental wave as $$V_{in\_max} \times \sin \theta_n,$$

wherein $V_{in\_max}$ is the maximum value of the input voltage, and $\sin \theta_n$ refers to a value of a sine wave at an n-th phase.

10. The method of claim 1, wherein the one or more differences between the input voltage and the fundamental wave are associated with one or more phases that differ by less than a threshold amount from a particular phase associated with the maximum value of the input voltage.

11. An apparatus comprising:

a measuring sensor configured to measure an input voltage from an input power supply to an electronic device;

a fundamental wave processor configured to generate a fundamental wave based on a maximum value of the input voltage and preset fundamental wave values;

an index processor configured to calculate at least one of an index value or an index variance with respect to the input power supply using a difference value between the input voltage and the fundamental wave; and a controller configured to identify a type of the input power supply based on the at east one of the index value or the index variance.

12. The apparatus of claim 11, wherein the fundamental wave processor determines a maximum input voltage value within a preset phase range as the maximum value, calculates a reference interval with respect to a fundamental wave table storing the values for the fundamental wave using a measurement frequency of the input voltage and a frequency of the input power, and generates the fundamental wave using a voltage value, which is determined with reference to the fundamental wave table according to the reference interval and the maximum input voltage value.

13. The apparatus of claim 11, wherein the index processor calculates respective sums of differences between the input voltage and the fundamental wave within a preset number of cycles of the input voltage, and determines one of a minimum value, a maximum value, or an average value of the respective sums of the differences for the preset number of cycles as the index value.

14. The apparatus of claim 11, wherein the index processor calculates respective sums of differences between the input voltage and the fundamental wave at different phases within a preset number of cycles of the input voltage, and determines a difference between two of a minimum value, a maximum value, and an average value of the respective sums as the index variance.

15. The apparatus of claim 11, wherein the controller determines the input power supply as commercially supplied power when the at least one of the index value or the index variance is less than or equal to respective preset reference values, and determines the input power supply as an uninterruptable power supply (UPS) when the at least one of the index value or the index variance is greater than the respective preset reference values.

16. The apparatus of claim 11, wherein the index processor calculates a load index value and a load index variance when the input voltage is used to drive a specific component of the electronic device, and calculates an idle index value and an idle index variance when the input voltage is not used to drive the specific component of the electronic device.

17. The apparatus of claim 16, wherein the controller determines the input power supply as commercially supplied power when at least one of a difference between the load index value and the idle index value or a difference value between the load index variance and the idle index variance is less than or equal to a preset reference value, and otherwise, determines the input power supply as a UPS when the at least one of the difference between the load index value and the idle index value or the difference between the load index variance and the idle index variance is greater than the preset reference value.

18. The apparatus of claim 11, wherein, when the input power supply is identified as a UPS, the controller further controls the electronic device to operate in a minimum power consumption mode.

19. The apparatus of claim 11, wherein the fundamental wave processor generates the fundamental wave based on an equation:

$$V_{in\_max} \times \sin \theta_n,$$

wherein $V_{in\_max}$ is the maximum value of the input voltage, and $\sin \theta_n$ refers to a value of a sine wave at an n-th phase.

20. The apparatus of claim 11, wherein the one or more differences between the input voltage and the fundamental wave are associated with one or more phases that differ by less than a threshold amount from a particular phase associated with the maximum value of the input voltage.

* * * * *